United States Patent [19]

Murakami et al.

[11] Patent Number: 5,189,383
[45] Date of Patent: Feb. 23, 1993

[54] CIRCUIT ELEMENT UTILIZING MAGNETOSTATIC WAVE

[75] Inventors: Yasuhide Murakami, Kumagaya; Kohei Ito, Fukaya, both of Japan

[73] Assignee: Hitachi Metals, Ltd., Tokyo, Japan

[21] Appl. No.: 754,521

[22] Filed: Sep. 4, 1991

[30] Foreign Application Priority Data

Sep. 5, 1990 [JP] Japan .................. 2-234976

[51] Int. Cl.$^5$ .......................... H03H 7/34; H01P 7/00
[52] U.S. Cl. ................................ 333/201; 333/219.2; 333/204
[58] Field of Search ............... 333/201, 219, 235, 245, 333/202, 141-156, 193-196, 246, 227, 230, 204, 205, 219.2, 33, 202 DB, 263; 331/96

[56] References Cited

U.S. PATENT DOCUMENTS

| | | | |
|---|---|---|---|
| 4,251,786 | 2/1981 | Goldie et al. | 333/219 X |
| 4,565,984 | 1/1986 | Castera et al. | 333/201 X |
| 4,743,874 | 5/1988 | Kinoshita et al. | 333/219 |
| 4,983,937 | 1/1991 | Kinoshita et al. | 333/202 |
| 5,017,895 | 5/1991 | Buck et al. | 333/202 X |
| 5,017,896 | 5/1991 | Adam et al. | 333/202 X |
| 5,053,734 | 10/1991 | Murakami et al. | 333/219.2 |

FOREIGN PATENT DOCUMENTS 62-245704 10/1987 Japan .
2-13101 1/1990 Japan .
0298101 12/1990 Japan .

OTHER PUBLICATIONS

IEEE Transactions on Magnetics, vol. MAG-20, No. 5, Sep. 1984, pp. 1232-1234 entitled, "MSSW Resonators With Straight Edge Reflectors".

Journal of Applied Physics vol. 36, No. 11, Nov. 1965, pp. 3453-3459 "Propagation of Magnetostatic Spin Wave at Microwave Frequencies in a Normally-Magnetized Disk*" by R. W. Damon and H. Van De Vaart.

*Primary Examiner*—Paul M. Dzierzynski
*Assistant Examiner*—Ali Neyzari
*Attorney, Agent, or Firm*—Finnegan, Henderson, Farabow, Garrett & Dunner

[57] ABSTRACT

A circuit element utilizing a magnetostatic wave is disclosed which uses a magnetostatic-wave resonator having a structure that a thin YIG (yttrium iron garnet) film is formed on a non-magnetic substrate such as a GGG (gadolinium gallium garnet) substrate. In this resonator, at least a part of end faces of the ferrimagnetic film are made rough such as by lapping with abrasives having a grain size greater than or equal to about 15 μm, to suppress the generation of a unnecessary spurious mode in a wide frequency range.

5 Claims, 3 Drawing Sheets

AFTER END FACE OF MAGNETIC FILM HAS BEEN PROCESSED

CIRCUIT ELEMENT UTILIZING MAGNETOSTATIC WAVE

BACKGROUND OF THE INVENTION

The present invention relates to a circuit element utilizing spin resonance in a thin magnetic film such as a thin YIG (yttrium iron garnet) film formed on a non-magnetic substrate such as a GGG (gadolinium gallium garnet) substrate, and more particularly to the structure of a circuit element utilizing a magnetostatic wave, for suppressing a spurious mode and for enabling the circuit element to operate in a wide frequency range.

It has been proposed to use a thin-film ferrimagnetic resonator which is obtained in such a manner that a thin YIG film is deposited, by liquid phase epitaxy, on a non-magnetic substrate made of GGG and is then processed so as to have a desired shape, in a microwave oscillation circuit or the like. (Japanese patent application JP-A-2-13101 and others)

This thin-film ferrimagnetic resonator has advantages that the sharpness Q of resonance is high in a microwave frequency band and the resonance frequency of the resonator can be varied depending upon the intensity of a D.C. bias magnetic field applied perpendicularly to the thin ferrimagnetic film which is magnetically coupled with a transmission line.

Further, a circuit element utilizing a magnetostatic wave due to the spin resonance in a thin ferrimagnetic film has been proposed, in which a microwave transmission line is formed on the thin ferrimagnetic film through photolithographic techniques, to readily adjust the coupling between the thin ferrimagnetic film and the transmission line and to enhance the degree of coupling therebetween. (See Japanese patent Application JP-A-62-245704 which corresponds to U.S. Pat. No. 4,743,874, and others)

FIG. 2A shows an example of the abovementioned conventional circuit element utilizing a magnetostatic wave, and FIG. 2B shows a magnetostaticwave resonator used in the circuit element of FIG. 2A.

Referring to FIG. 2B, a magnetostatic-wave resonator 6 is formed in such a manner that a thin YIG film 3 is deposited on a GGG substrate 2 by liquid phase epitaxy, a gold or aluminum film is deposited on the YIG film 3, and one or more finger electrodes 5 and a pair of pad electrodes 4a and 4b are formed of the gold or aluminum film through photolithographic techniques so that the pad electrodes 4a and 4b are disposed on both sides of each finger electrode 5. The conventional circuit element utilizing a magnetostatic wave employs the resonator 6, and is constructed as shown in FIG. 2A. In FIG. 2A, reference numeral 1 designates the circuit element, 6 the magnetostatic-wave resonator, 7 a matching stub, 11 a conductor plate, 12a and 12b connecting plates, 13 an earthing plate, 14 a dielectric material, and 15 a micro strip line.

Owing to the mechanism of resonance, the above circuit element using the thin YIG film can operate at temperatures lower than the operation temperature of the well-known circuit element using a YIG sphere. Moreover, the former circuit element is relatively inexpensive, because the cumbersome step of forming the YIG sphere is not required.

When the band pass characteristics of the circuit element 1 of FIG. 2A are measured, a spurious mode frequently appears in the neighborhood of the lowest one of resonance modes, as shown in FIG. 3A. In many cases, the dependence of the resonance frequency of the spurious mode on an external magnetic field differs a little from the external magnetic field dependence of the resonance frequency of the lowest resonance mode. Accordingly, as shown in FIG. 3B, the positional relation between the spurious mode and the lowest resonance mode varies with resonance frequency. This fact will be explained below in more detail. When a resonance spectrum is observed while changing the resonance frequency of the lowest mode by varying the intensity of an external magnetic field gradually, a spurious mode appearing on one side of a peak due to the lowest resonance mode gradually approaches the peak, passes through the peak, and then moves to the other side of the peak. (See IEEE TRANS on MAGNETICS Vol. MAG-20, No. 5, Sep. 1984) Thus, in a case where the magnetostatic-wave resonator is used for forming a microwave oscillation circuit, when the operating point of the oscillation circuit passes through the resonance frequency of the spurious mode, there arises a problem that an oscillation frequency changes discontinuously as shown in FIG. 5A. Further, when the spurious mode and the lowest resonance mode overlap each other, there arises another problem that the shapness Q of resonance is greatly reduced.

SUMMARY OF THE INVENTION

It is an object of the present invention to provide the structure of a circuit element utilizing a magnetostatic wave, for suppressing the spurious mode in a wide frequency range.

In order to attain the above object, according to the present invention, there is provided a circuit element utilizing a magnetostatic wave which circuit element comprises: means for exciting a magnetostatic wave; and a medium for propagating the magnetostatic wave, at least a part of end faces of the medium being made rough.

As is well known, in a case where the volume of the magnetic medium is supposed to be infinite, the spin resonance occurs abruptly in the magnetic medium when the frequency of an applied microwave becomes equal to a Larmor frequency corresponding to an applied magnetic field. At this time, the phase of spin is constant in the whole of the magnetic medium. That is, the spin in the magnetic medium is put in the so-called uniform resonant state. Actually, the volume of the magnetic medium is finite. Accordingly, in order to reduce the magnetostatic energy of the whole of the magnetic medium in accordance with the boundary condition thereof, the phase of spin varies gradually in the magnetic medium. At this time, the phase of spin changes in the magnetic medium as if the change of the phase were a wave. Thus, the change of phase of spin is called "magnetostatic wave".

In a case where the magnetic medium has a special shape, the dispersion of the magnetostatic wave in the magnetic medium can be calculated by using a convenient approximation, and thus it is known that a multiplicity of modes are formed for a single boundary condition. (See to Journal of Applied Physics Vol. 36, No. 11, Nov. 1965)

Although the above-mentioned spurious mode is to be determined from the boundary condition and properties of the magnetic film used, it is very difficult to know which of resonance modes is the spurious mode. The present inventors, however, have inferred, in relation to the dispersion of frequencies, that each of most spurious modes shows a non-uniform change of magnetization in the direction of thickness of the magnetic film, that is, the spurious mode is a higher mode when viewed in the direction of thickness of the magnetic film, and moreover the spurious mode is a higher resonance mode in the surface of the magnetic film.

When the magnetostatic wave is considered to be a kind of wave, the end face of the magnetic film acts as a wave reflecting wall. That is, in a magnetostatic-wave resonator, a magnetostatic wave is confined in a magnetic medium whose end face acts as a reflecting surface, and resonance occurs only when the wave incident to the reflecting surface and the wave reflected from the reflecting surface have the same phase to intensify each other.

Accordingly, it is the common sense of those skilled in the art that the wave reflecting wall is required to be macroscopically smooth and perpendicular to the propagation plane of the magnetostatic wave. In a case where the reflecting wall is not smooth, the magnetostatic wave is reflected from the reflecting wall in a plurality of different directions, that is, the magnetostatic wave is scattered, and thus the resonance condition is not satisfied.

In an ordinary circuit element including a thin ferrimagnetic film to utilize a magnetostatic wave, however, a resonance mode having the smallest wave number and a long wavelength is mainly used. Accordingly, the diffraction of the magnetostatic wave is remarkable in the neighborhood of the reflecting surface, and it has been determined by the present invention that the generation of the main resonance mode will be scarcely affected by making end faces of thin ferrimagnetic film rough. The present inventor's have also found, on the other hand, that the generation of a higher resonance mode in the direction of thickness of the thin ferrimagnetic film and in the surface thereof will be surely prevented by roughened end faces of the thin ferrimagnetic film.

According to the present invention, the above fact is utilized to realize means for suppressing only an unnecessary spurious mode without exerting a great influence on the generation of a main resonance mode.

BRIEF DESCRIPTION OF THE DRAWINGS

FIGS. 4A-1 and 4A-2 show measured values of the impedance of the conventional circuit element of FIG. 2A.

FIGS. 4B-1 and 4B-2 show measured values of the impedance of an inventive circuit element utilizing a magnetostatic wave.

DESCRIPTION OF THE PREFERRED EMBODIMENTS

The present invention will be explained below in detail, on the basis of embodiments thereof.

CONVENTIONAL EXAMPLE

Figure 1:
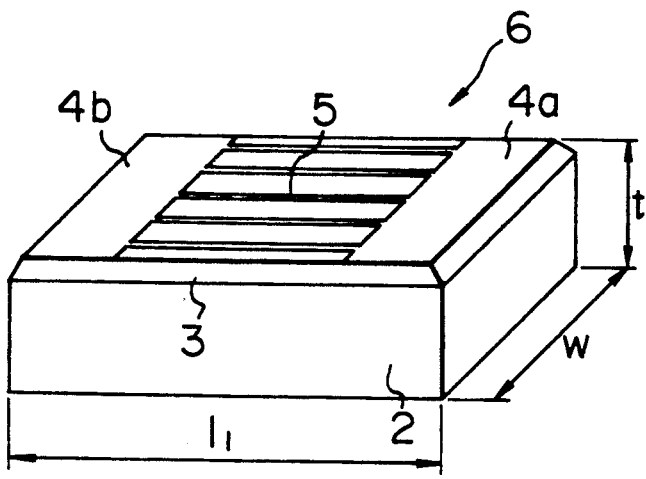
FIG. 1 is an explanatory view showing an embodiment of a magnetostatic-wave resonator according to the present invention.
Figure 2A:
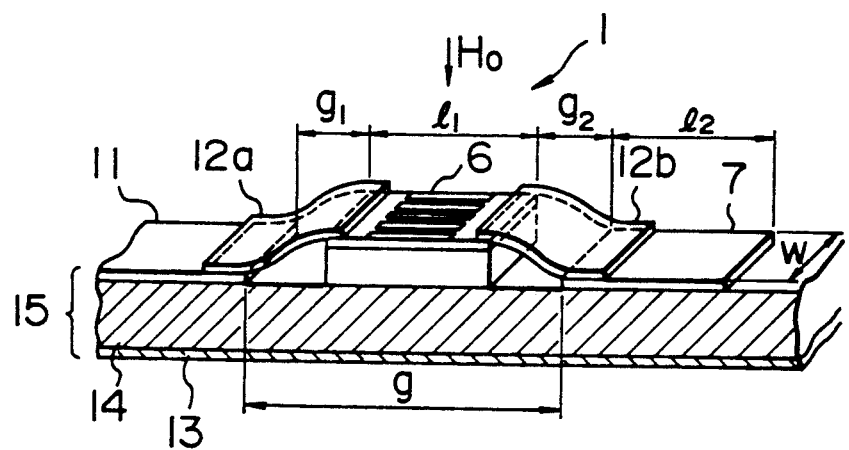
FIG. 2A is a diagram showing a conventional circuit element utilizing a magnetostatic wave.
Figure 2B:
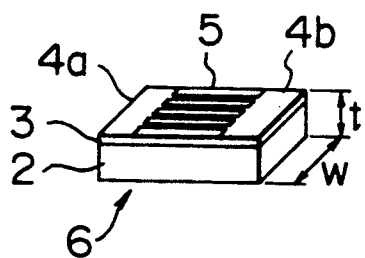
FIG. 2B is an explanatory view showing a conventional magnetostatic-wave resonator of FIG. 2A.

For comparison with the invention shown in FIG. 1, a YIG film 3 having a thickness of about 40 $\mu$m is deposited on a monocrystalline GGG substrate 2 by liquid phase epitaxy, and then a gold film having a thickness of 1.5 $\mu$m is formed on the YIG film 3 by the vacuum evaporation method. Thereafter, the gold film is selectively etched off through photolithographic techniques to form five finger electrodes 5 each having a width of 30 $\mu$m and a length of 3 mm, and to form pad electrodes 4a and 4b on both sides of each finger electrode. The wafer thus obtained is cut by a dicer having a diamond blade, to obtain a magnetostatic-wave resonator 6 having a length of 5 mm, a width of 2 mm and a thickness of 0.5 mm. However, as compared to the invention as described in EMBODIMENT-1 below, the ends of the YIG film parallel to the lengthwise direction were not further processed to roughen the surfaces thereof.

Figure 3A:
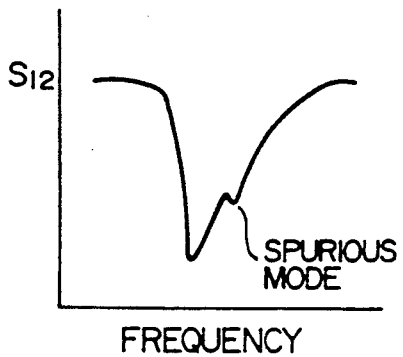
FIGS. 3A and 3B are graphs showing measured values with respect to the band pass characteristic of the conventional circuit element of FIG. 2A.
Figure 3B:
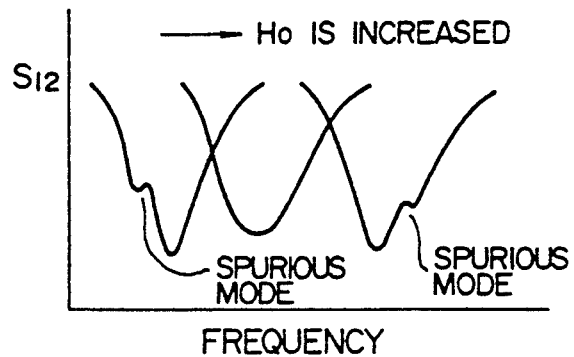

An appropriate bias magnetic field $H_o$ was applied to the above resonator so that the resonator had a resonance frequency of about 5.0 GHz. In this state, the band pass characteristics of the resonator were observed with the aid of a network analyzer. A spurious made was observed in the vicinity of a main resonance mode, as shown in FIG. 3A. When the resonance frequency was increased to about 5.6 GHz by changing the intensity of the bias magnetic field gradually, the spurious mode on the low-frequency side of the main resonance frequency moved to the high-frequency side thereof, as shown in FIG. 3B.

EMBODIMENT

FIG. 1 shows an embodiment of a magnetostatic-wave resonator according to the present invention.

A magnetostatic-wave resonator similar to that described in the CONVENTIONAL EXAMPLE is prepared. However, the end faces of the YIG magnetic film 3 parallel to the lengthwise direction of the resonator are made rough.

In order to roughen the YIG film end faces, a side face of the resonator parallel to the lengthwise direction thereof are fixed to an abrasive jig by wax, and end faces of the magnetic film are made rough by a lapping operation using an abrasive grain which is made of silicon carbide and has a grain size of 44, 20, 15, or 10 $\mu$m.

Figures 1, 4A:
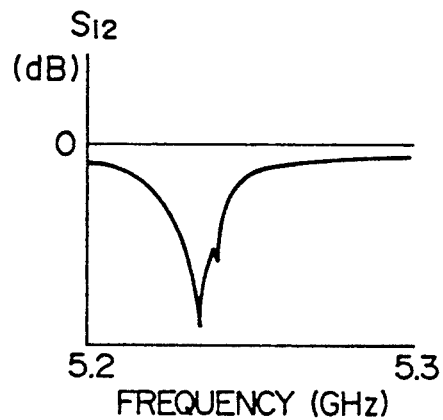
Figures 2, 4A:
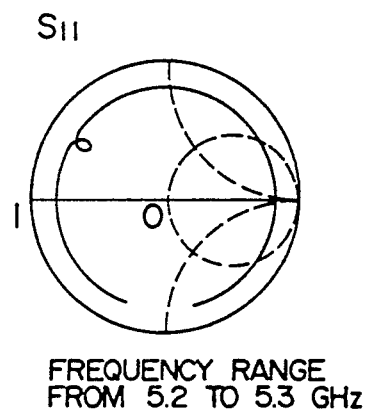
Figures 1, 4B:
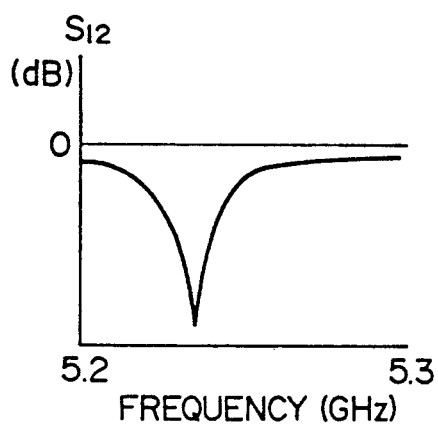
Figures 2, 4B:
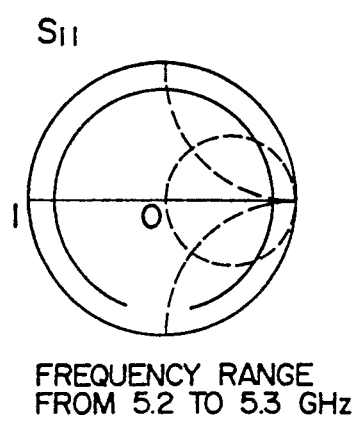

The band pass characteristics of the resonator thus processed were measured as in the CONVENTIONAL EXAMPLE. In a case where end faces of the magnetic film were lapped by an abrasive grain having a grain size of 10 $\mu$m, a spurious mode was observed in the vicinity of a main resonance frequency of 5.0 to 5.3 GHz, as shown in FIG. 4A. In a case where end faces of the magnetic film were lapped by an abrasive grain having a grain size of 15 $\mu$m or more, no spurious mode was observed in a frequency range between a main resonance frequency of 5.0 to 5.5 GHz plus 20 MHz and the main resonance frequency minus 20 MHz, as shown in FIG. 4B.

EMBODIMENT-2

A resonator similar to that described in the EMBODIMENT-1 is prepared. In the present embodiment, however, end faces of the magnetic film 3 on the pad-electrode side are lapped with an abrasive grain made of alumina and having a grain size of 44 μm, to be made rough.

Figure 5A:
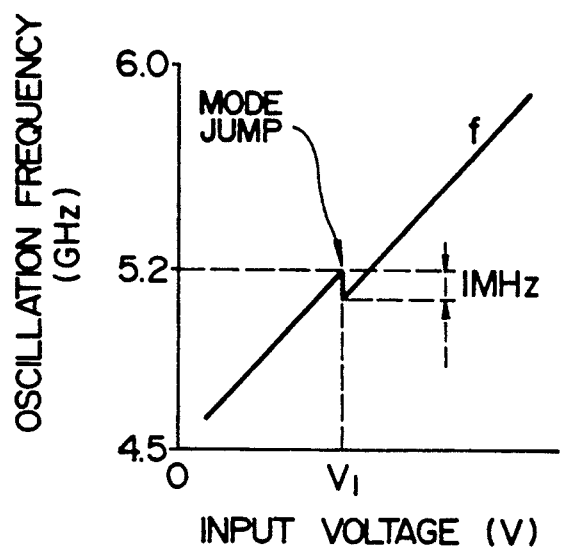
FIG. 5A is a graph showing oscillation-frequency characteristics of a magnetostatic-wave resonator obtained before end faces of a YIG film are processed, that is, oscillation-frequency characteristics of the conventional magnetostatic-wave resonator.
Figure 5B:
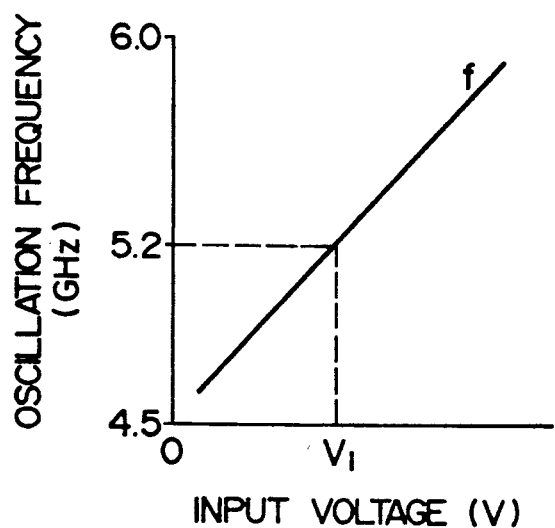
FIG. 5B is a graph showing oscillation-frequency characteristics of a magnetostatic-wave resonator obtained after end faces of a YIG film have been processed, that is, oscillation-frequency characteristics of a magnetostatic-wave resonator according to the present invention.

The band pass characteristics of the resonator thus processed were measured as in the CONVENTIONAL EXAMPLE. No spurious mode was observed in a frequency range between a main resonance frequency of 5.0 to 5.5 GHz plus 20 MHz and the main resonance frequency minus 20 MHz. Although a mode jump in oscillation frequency was observed for the resonator of the CONVENTIONAL EXAMPLE as shown in FIG. 5A, no jump mode was observed for the resonator of the EMBODIMENT-2 as shown in FIG. 5B.

As has been explained in the above, according to the present invention, end faces of the magnetic film of a magnetostatic-wave resonator are made rough, to suppress the generation of a spurious mode in a wide frequency range.

In the EMBODIMENT-1 and EMBODIMENT-2, a rectangular resonator has been explained, by way of example. The present invention is not limited to the rectangular resonator, but is applicable to other circuit elements such as a circular resonator, a filter and a delay line. That is, the present invention can suppress the generation of a spurious mode in such circuit elements.

We claim:

1. A circuit utilizing a magnetostatic wave, comprising:
    means for exciting a magnetostatic wave; and
    a member having end faces and being operatively connected to said exciting means for propagating the magnetostatic wave, at least one of said end faces of the member being a rough surface, wherein said at least one rough end face has a roughness corresponding to that produced by lapping with an abrasive having grain size greater than or equal to about 15 μm.

2. The circuit element utilizing a magnetostatic wave as claimed in claim 1, wherein a magnetostatic wave resonator is used which has a thin ferrimagnetic film formed on a non-magnetic substrate, and at least one finger electrode and a pad electrode formed on the ferrimagnetic film to provide said means for exciting a magnetostatic wave in the ferrimagnetic film by a microwave, and for propagating the magnetostatic wave, thereby generating resonance, and wherein the ferrimagnetic film is used as the member for propagating the magnetostatic wave.

3. The circuit element utilizing a magnetostatic wave as claimed in claim 1, wherein a magnetostatic wave resonator is used which has a thin ferrimagnetic film formed on a non-magnetic substrate, and an electrode is formed on another substrate to provide said means for exciting a magnetostatic wave in the ferrimagnetic film by a microwave applied to the electrode, and for propagating the magnetostatic wave, thereby generating resonance, and wherein the ferrimagnetic film is used as the member for propagating the magnetostatic wave.

4. An improved magnetostatic wave resonator comprising a non-magnetic substrate, a thin ferrimagnetic film member formed thereon, said film serving as the medium in which the magnetostatic wave is to be generated and propagated, said film member having end faces, wherein at least one of said end faces is rough for suppressing spurious resonance modes, and wherein said at least one rough end face has a roughness corresponding to that produced by lapping with an abrasive having grain size greater than or equal to about 5 μm.

5. The improved magnetostatic wave resonator as in claim 4, further including exciting electrode means formed on the surface of said film member.

* * * * *

UNITED STATES PATENT AND TRADEMARK OFFICE
CERTIFICATE OF CORRECTION

PATENT NO. :
DATED : 5,189,383
INVENTOR(S) : February 23, 1993
Yusuhide Murakami et al.

It is certified that error appears in the above-identified patent and that said Letters Patent is hereby corrected as shown below:

Claim 4, column 6, line 36, "5 μm" should be
--15 μm--.

Signed and Sealed this

Thirtieth Day of November, 1993

Attest:

BRUCE LEHMAN

*Attesting Officer*   *Commissioner of Patents and Trademarks*